United States Patent [19]

Noguera et al.

[11] Patent Number: 5,072,192

[45] Date of Patent: Dec. 10, 1991

[54] PHASE LOOP DEMODULATOR

[75] Inventors: Christian Noguera, Toulouse; Pascal Triaud, Tournefeuille; Jean-Luc Foucher, Seysses, all of France

[73] Assignee: Alcatel Espace, Courbevoie, France

[21] Appl. No.: 627,107

[22] Filed: Dec. 13, 1990

[30] Foreign Application Priority Data

Dec. 15, 1989 [FR] France ................................ 89 16621

[51] Int. Cl.⁵ ............................................. H03D 3/00
[52] U.S. Cl. ........................................ 329/325; 331/10
[58] Field of Search ............... 329/323, 324, 325, 326; 331/10

[56] References Cited

U.S. PATENT DOCUMENTS 3,710,261  1/1973  Low et al. ............................ 325/346
3,909,735  9/1975  Anderson et al. ................... 329/122

FOREIGN PATENT DOCUMENTS 2007445  5/1979  United Kingdom .

OTHER PUBLICATIONS

Patent Abstracts of Japan, vol. 9, No. 277 (E-355) [2000], Nov. 6, 1985; & JP-A-60 120 619 (Sony K.K.) 6/28/85.
Patent Abstracts of Japan, vol. 10, No. 24 (E-377) [2081], Jan. 30, 1986; & JP-A-60 182 820 (Fujitsu K.K.) 9/18/85.

Primary Examiner—Robert J. Pascal
Attorney, Agent, or Firm—Sughrue, Mion, Zinn, Macpeak & Seas

[57] ABSTRACT

A phase loop demodulator, in particular for space telecommunications, comprises a primary phase loop, a locking detector circuit responsive to acquisition by the primary loop, and a secondary phase loop controlled by said detector circuit.

5 Claims, 2 Drawing Sheets

PHASE LOOP DEMODULATOR

The invention relates to a phase loop demodulator.

BACKGROUND OF THE INVENTION

The manual by Floyd and Gardner entitled "Phase-lock techniques" (2nd edition, pp. 182-183) describes a prior art phase loop demodulator comprising an input bandpass filter, a phase loop including a phase detector, a loop filter, and a voltage controlled oscillator (VCO), with a de-emphasis filter being disposed at the output from the phase loop.

In such a phase loop, any difference between the frequency (Fe) of the carrier to be demodulated and the rest frequency of the VCO (Fvco)$_0$, that may be due to VCO aging, or to drift in the carrier, ..., gives rise to a static phase error at the output from the loop phase comparator, and consequently to:
- degradation in the threshold of the demodulator; and
- greater sensitivity to "click" phenomena.

An object of the invention is to mitigate such drawbacks.

SUMMARY OF THE INVENTION

To this end, the present invention provides a phase loop demodulator comprising a primary phase loop and a secondary loop, wherein the demodulator includes a circuit for detecting primary loop locking, and which, once locking has been detected, switches on said secondary loop, said secondary loop participating in increasing the DC gain of the primary phase loop.

Advantageously, the invention makes it simple to reduce the static phase error at the output from the phase loop comparator. It makes it possible to maintain phase loop performance even when various causes such as temperature variation, aging, radiation, ..., give rise to an offset between the carrier frequency and the VCO frequency within the limits of the acquisition band.

The invention makes it possible to increase the DC loop gain under steady state conditions once phase locking has been achieved.

BRIEF DESCRIPTION OF THE DRAWINGS

An embodiment of the invention is described by way of example with reference to the accompanying drawings, in which.

DETAILED DESCRIPTION

Figure 1:
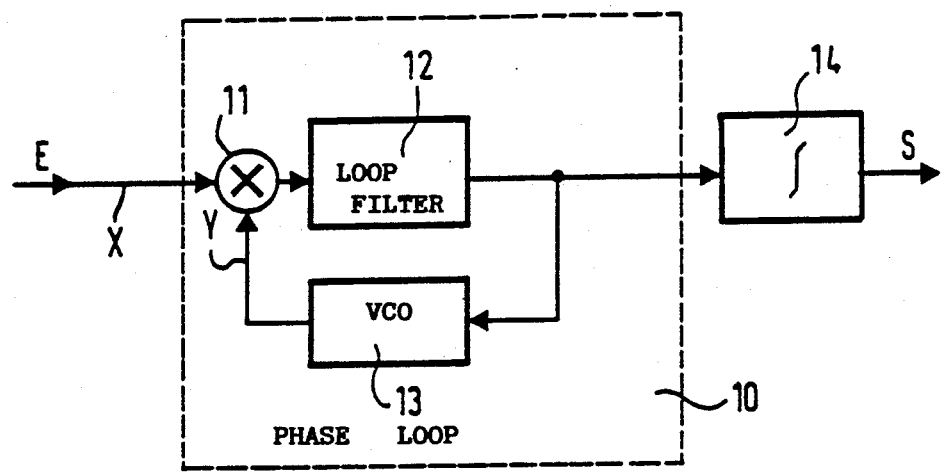
FIG. 1 is a diagram of a prior art demodulator.

The prior art demodulator shown in FIG. 1 comprises a phase loop 10 and an output integrator 14. The phase loop 10 comprises a phase comparator 11, a loop filter 12, and a VCO 13 looped back onto the phase comparator. The output integrator 14 is connected to the output from the phase loop 12.

A phase comparator is a non-linear device and it operates best in conjunction with a static phase error that is zero.

Assuming that the comparator 11 has a gain Kd, that the VCO 13 has a slope Ko, and that the input signals to the comparator 11 are as follows:

$$X = A \sin[w_0 t + \phi e(t)]$$

$$Y = B \cos[w_0 t + \phi s(t)]$$

then the following transfer function applies, with
- $\phi d$ = phase of the demodulated signal
- $\phi e$ = phase of the input signal
- $B$ = acquisition band $$\phi d / \phi e = Kd.F(p)/(p + Ko.Kd.F(p))$$

$$B = \frac{Kt}{2\pi} \sqrt{2 \frac{f_1}{f_2}}$$

with $F(p) = F(o).(1 + \tau 2p)/(1 + \tau 1p)$
and $KT = Ko.Kd.F(o)$, $f_1 (= 1/\tau 1)$ and $f_2 (= 1/\tau 2)$
being the poles of the loop filter 12.

The static phase error $\delta\phi$ due to a frequency difference or offset between Fe and (Fvco)$_0$ is given by:

$$\delta\phi = (Fe - (Fvco)_0)/KT$$

The value of KT is limited by:
- the difficulty in making amplifiers having both high gain and large bandwidth; and
- the sensitivities of the phase comparator and of the VCO.

Figure 2:
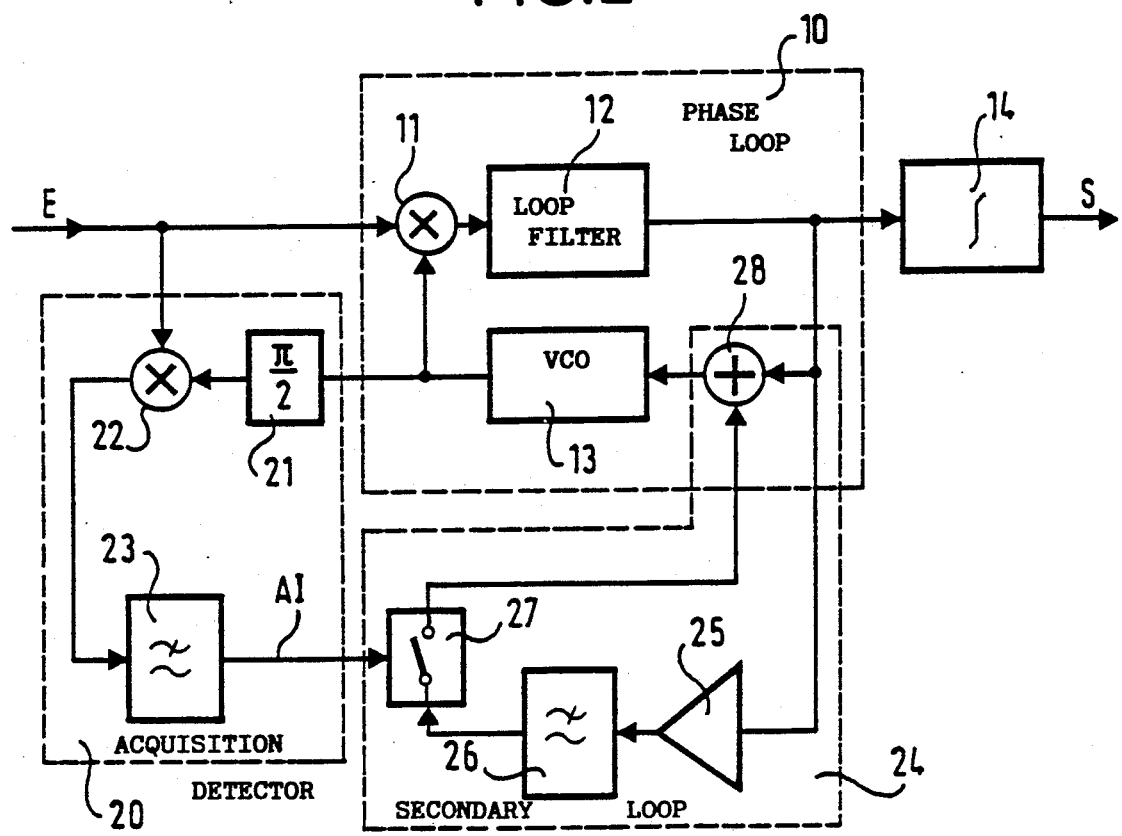
FIG. 2 is a diagram of a modulator of the invention.

The demodulator of the invention, as shown in FIG. 2, includes the same basic circuits as the prior art demodulator, and these circuits are therefore given the same references: the phase loop 10 and the output integrator 14.

It additionally includes a lock detector 20 which includes a $\pi/2$ phase shifter 21 connected to the output of the VCO 13, followed by a phase comparator 22 whose second input is connected to the input E of the demodulator, and whose output is connected to a lowpass filter 23 which delivers a lock-indicating signal AI.

In addition, it includes a second phase loop referred to as a "secondary" loop 24 which is connected to the output of the loop filter 12 and includes an amplifier 25 followed by a lowpass filter 26 and a switch 27 connected to a summing circuit 28 which is interposed in the primary loop 10 between the loop filter 12 and the VCO 13. The switch 27 is controlled by the lock detection signal AI from the lock detector 20.

The invention makes it possible to reduce the phase error term $\delta\phi$ when locking is achieved.

Prior to locking, the switch 27 is open and the secondary loop 24 is not used. This reduces to the conventional phase loop shown in FIG. 1. The acquisition band is given by the formula mentioned above:

$$B = \frac{Kt}{2\pi} \sqrt{2 \frac{f_1}{f_2}}$$

Once locking is achieved, the carrier and the output from the VCO 13 are in quadrature, and a detection maximum is obtained at the output from the lock detector 20. The switch 27 then switches the secondary loop 24 into operation. This loop comprises an amplifier 25 of gain G and a lowpass filter 26, with the cutoff frequency Fc of this filter being very low (a few Hertz) so as to avoid giving rise to an interferring pole in the loop.

The following then applies:

$$\phi d / \phi e = Kd.F(p)/(p + Ko.Kd.F(p).[1 + G(p)])$$

For modulation frequencies that are much higher than the cutoff frequency Fc (in practice a modulation frequency f>10.fc), demodulation performance is the same as primary phase loop performance since $G(p) \approx 0$.

The total DC loop gain is: $KT[1+G(0)]$.

The expression for static phase error becomes:

$$\phi p = (Fe - Fvco)/KT[1+G(0)]$$

and $\phi p$ with the secondary loop = $\phi p$ without the secondary loop divided by $(1+G(0))$, so that the gain for static phase error becomes $1/[1+G(0)]$.

Measurements of demodulation performance have been performed by simulating differences between Fe and $(Fvco)_0$.

Under the following conditions:

$$Fe - (Fvco)_0 = 1000 \text{ kHz}$$
$$G(0) = 40$$
$$fc = 10 \text{ Hz}.$$

The primary loop locks in about 10 μs. The secondary loop locks in a few hundred milliseconds. The demodulator threshold is extended by about 2.2 dB.

Figure 3:
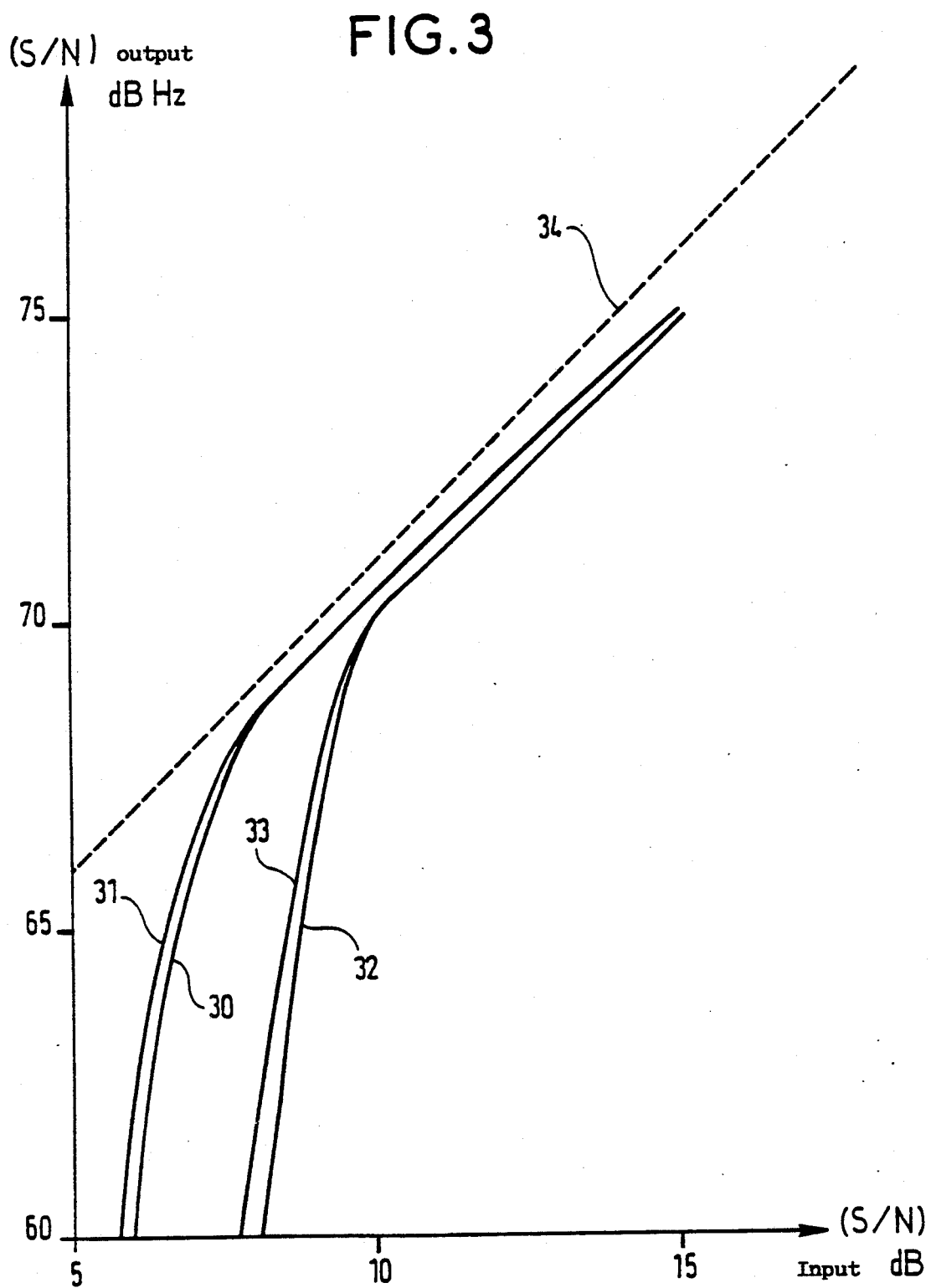
FIG. 3 is a graph showing the demodulation performance of the prior art demodulator and of the demodulator of the invention.

Curves 30, 31, 32, and 33 shown in FIG. 3 show the demodulation performance of the conventional phase lock loop shown in FIG. 1 and of the phase lock loop of the invention when the difference between the carrier to be demodulated and the rest frequency of the VCO is close to +1 MHz. Curves 30 and 31 correspond to the phase demodulator of the invention while curves 32 and 33 corresponding to the conventional demodulator.

In FIG. 3, curves 30 and 32 correspond to 139 MHz. Curves 31 and 33 correspond to 141 MHz with a modulation frequency fm of 8 kHz and a phase modulation index m of 1.2 rd. Curve 34 is a theoretical straight line corresponding to an ideal phase demodulator.

The threshold improvement (defined by the 1 dB compression point) is of the order of 2.2 dB.

The invention thus makes it possible to reduce the static phase error $\delta \phi$ by making use, after acquisition, of the secondary loop 24 (automatic frequency control) which participates in increasing the DC gain of the primary phase loop without altering its parameters: namely loop bandwidth $w_n$ and damping with respect to modulation; locking performance (acquisition bandwidth) is conserved.

The circuit of the invention is used for Tracking, Telemetry, and Command (TTC) receivers of the Eutelsat II and Telecom II type.

Naturally the present invention is described and shown merely by way of preferred example and it component parts could be replaced by equivalents without thereby going beyond the scope of the invention.

We claim:

1. A phase loop demodulator comprising:
   a primary phase loop;
   a secondary loop, selectively connected in series with said primary phase loop, for increasing a DC gain of said primary phase loop; and
   detecting means for detecting a locking state of said primary phase loop, and for causing said secondary loop to be connected in series with said primary phase loop in response to the detected locking state of said primary phase loop, thereby increasing the DC gain of said primary phase loop.

2. The demodulator according to claim 1, wherein said secondary loop is connected to the output of said primary phase loop, said secondary loop comprises an amplifier, a low pass filter coupled to an output of said amplifier, and a switch coupled to an output of said low pass filter, said primary phase loop includes a VCO and a loop filter, said demodulator further comprises a summing circuit which is interposed in said primary phase loop between said loop filter and said VCO, said detecting means outputs a signal when the locking state is detected, and wherein said switch is controlled according to the signal output by said detecting means.

3. The demodulator according to claim 1, wherein the primary phase loop comprises a phase comparator, a loop filter, and a VCO coupled between an input of said phase comparator and an output of said loop filter.

4. The demodulator according to claim 3, further comprising an output integrator coupled to receive an output of said primary phase loop.

5. The demodulator according to claim 1, wherein said primary phase loop includes a VCO, and wherein said detecting means comprises a $\pi/2$ phase shifter connected to an output of said VCO, a phase comparator connected to receive an input of said demodulator, and a low pass filter, coupled to receive an output of said phase comparator, for providing a signal representing that the locking state has been detected.

* * * * *